(12) United States Patent
Dams

(10) Patent No.: US 7,385,678 B2
(45) Date of Patent: Jun. 10, 2008

(54) POSITIONING DEVICE AND LITHOGRAPHIC APPARATUS

(75) Inventor: Johannes Adrianus Antonius Theodorus Dams, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 295 days.

(21) Appl. No.: 10/957,744

(22) Filed: Oct. 5, 2004

(65) Prior Publication Data
US 2006/0072098 A1 Apr. 6, 2006

(51) Int. Cl.
G03B 27/58 (2006.01)
G03B 27/42 (2006.01)
G03B 27/62 (2006.01)

(52) U.S. Cl. ............. 355/72; 355/53; 355/75; 310/12

(58) Field of Classification Search .......... 355/53, 355/72–76; 310/10, 12
See application file for complete search history.

(56) References Cited

U.S. PATENT DOCUMENTS

| | | | |
|---|---|---|---|
| 6,054,784 A * | 4/2000 | Sperling et al. ............ 310/12 |
| 6,150,740 A * | 11/2000 | Slocum ..................... 310/12 |
| 6,163,091 A * | 12/2000 | Wasson et al. ............. 310/12 |
| 6,359,679 B1 * | 3/2002 | Ito et al. ................... 355/75 |
| 6,597,435 B2 * | 7/2003 | Poon et al. ................ 355/75 |
| 7,034,920 B2 * | 4/2006 | Kwan et al. ............... 355/53 |
| 2001/0015799 A1 * | 8/2001 | Asano et al. .............. 355/72 |
| 2002/0018195 A1 * | 2/2002 | Iwamoto et al. ........... 355/72 |
| 2003/0007140 A1 * | 1/2003 | Korenaga .................. 355/72 |
| 2003/0111912 A1 * | 6/2003 | Binnard et al. ............ 310/12 |

* cited by examiner

Primary Examiner—Hung Henry Nguyen
(74) Attorney, Agent, or Firm—Pillsbury Winthrop Shaw Pittman LLP

(57) ABSTRACT

A positioning device for positioning an object table relative to a reference frame with a drive unit including a first part connectable to the reference frame and a second part for holding the object table is described. The drive unit is constructed to displace the object table in a first direction by generating a force in the first direction on the second part, and a torque acting on the second part about an axis substantially perpendicular to the first direction such that the resulting force of the force and the torque is directed substantially through the center of gravity of the assembly including the object table and the second part.

29 Claims, 9 Drawing Sheets

PRIOR ART

POSITIONING DEVICE AND LITHOGRAPHIC APPARATUS

BACKGROUND

1. Field of the Invention

The present invention relates to a lithographic apparatus and a positioning device, which can be used in a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Such a lithographic apparatus may further include one or more positioning devices for displacing and positioning an object table provided with, e.g., the substrate or the patterning device.

Drive units such as linear motors, planar motors or linear actuators are often applied in the positioning device for generating the desired force. Examples of such positioning devices including linear motors can, for example, be found in U.S. Pat. No. 5,815,246 and U.S. Pat. No. 5,969,441. In general, such drive units or motors include a first part that includes an array of permanent magnets (also referred to as the magnet array) that extends in a first direction and a second part that includes a plurality of coils (also referred to as the coil assembly), positioned adjacent to each other in the first direction. During operating, the coils are supplied with an electric current (e.g. from a three-phase current supply) thus generating an electromagnetic force between the first part and the second part of the motor.

In general, some type of bearing may be provided between the first part and the second part allowing both parts to be displaced relative to each other in the first direction. Additionally, the bearing may be arranged to maintain a predefined distance between the first and second part in a second direction substantially perpendicular to the first direction. Examples of such bearings are gas bearings (such as air bearing), ball bearings or slide bearings. In case of an air bearing (or any other gas bearing), a pre-load force is often applied. This pre-load force may be provided by, e.g., the weight of the moving assembly (in case the second direction corresponds to the vertical direction) or may be provided by a separate unit including, for example, a ferromagnetic member attached to the first part and a permanent magnet member attached to the second part.

In a lithographic projection apparatus, such a pre-loaded air bearing is often applied since it allows a displacement that is substantially frictionless and contactless. The latter is beneficial in that it may reduce the risk of contamination (by particles) that could occur in other types of bearings such as ball bearings. Such an air bearing usually extends along the first direction or includes various so-called bearing pads that are arranged along the first direction. In such an arrangement, the repelling force of the air bearing combined with the attractive pre-load force provides an equilibrium force at certain value of the distance between the first part and the second part in the second direction.

In many apparatuses, e.g. a lithographic apparatus, the positioning devices are designed as light as possible, in order, for example, to improve the dynamic behavior of the apparatus and to increase the productivity yield.

SUMMARY

The present invention is based on the fact that existing positioning devices can be made lighter when occurring disturbances, such as, e.g., an inertial torque, are corrected for by means of the positioning device. An inertial torque may occur in case the generated motor force is not in line with the center of gravity of the mass that is displaced. In this case, acceleration or deceleration of the moving mass (e.g. the object table combined with the coil assembly of the linear motor) would, result in a torque (inertial torque) acting on the moving mass. Due to the inertial torque, the force or force distribution on the bearing in the second direction may change. This could result in an unwanted change in position of the object table in the second direction due to a change in the equilibrium between the repelling bearing force and the attractive pre-load force. Alternatively or additionally, the occurrence of the inertial torque may cause damage to the bearing. To accommodate for the occurrence of such a disturbance, the bearing assembly of conventional positioning devices is often oversized, resulting in an inferior overall performance of the positioning device.

In an embodiment of the present invention, the dynamic performance of a positioning device is improved by reducing the impact of an inertial torque acting on the bearing of a positioning device.

According to an embodiment of the invention, there is provided a positioning device for positioning an object table relative to a reference frame, including a drive unit including a first part connectable to the reference frame and a second part constructed and arranged for holding the object table, the drive unit being constructed and arranged to displace the object table in a first direction by generating, in use, a force in a first direction on the second part, the positioning device being provided with a bearing such that the first part and the second part can displace relative to each other in the first direction by the drive unit and wherein the drive unit is constructed and arranged to generate, in use, a torque acting on the second part about an axis substantially perpendicular to the first direction such that the resulting force of the force and the torque is directed substantially through a center of gravity of an assembly including the object table and the second part.

When an object table is positioned with a positioning device including a conventional drive unit or motor, acceleration or deceleration of the object table may introduce an inertial torque acting on the moving assembly (i.e. the object table and the part of the drive unit attached to it) in case the generated motor force is not directed through the center of gravity of the moving assembly. This inertial torque also acts on the bearing of the positioning device causing a change in the bearing force in a second direction substantially perpendicular to the first direction and to the axis. A variation in the force acting on the bearing in the second direction may be undesired because this may affect the relative position between first and second parts in the second direction (as a consequence, the absolute position of the object table may also change).

As an example, an air bearing including two bearing pads along the first direction and pre-loaded by a magnetic force may be considered. In such an arrangement, the occurring inertial torque can either result in an increase or a decrease of the pre-load force acting on the bearing pads (depending on the position of the bearing pads relative to the center of gravity). An increase of the pre-load force may result in a decrease of the gap between both moving parts. This may even result in a situation whereby both moving parts touch each other causing damage to the bearing. A decrease in the resulting pre-load force may increase the distance between both moving parts to the extend that a proper operation of the bearing is no longer ensured. Similar problems may also occur with other types of bearings. The proper operation of conventional bearings such as ball bearings or slide bearings may also be compromised due to the occurrence of a force acting on the bearing in a direction substantially perpendicular to the first direction. A force like this might also cause excessive wear of the bearing parts, possibly endangering the desired life cycle of the part.

In a positioning device according to an embodiment of the invention, the first drive unit generates a torque in order to, at least partly, compensate for the inertial torque. By doing so, the force acting on the bearing does not experience a substantial change due to the acceleration or deceleration of the object table. Therefore, the bearing assembly can be reduced in size since it doesn't have to cope with a substantial force variation during operation.

In an embodiment of the present invention, the first part includes a magnet assembly provided with an array of permanent magnets constructed and arranged to generate a periodically alternating magnetic field distribution and wherein the second part includes a coil assembly provided with a first and a second coil set positioned adjacent to each other in the first direction. In such an arrangement, each coil set can generate by interaction with the magnetic field, when supplied with the appropriate currents, a force parallel to a plane defined by the first and second direction. By providing two separate coil sets adjacent to each other in the first direction, one can both provide a resulting force in the first direction to displace the object table and a torque (e.g. by generating a force in the positive sense of the second direction by the first coil set and a force in the negative sense of the second direction in the second coil set) to compensate, at least partly, an inertial torque occurring due to a mismatch between the center of gravity of the moving assembly and the second part of the drive unit. In an embodiment of the present invention, the magnetic field distribution has a magnetic period that is substantially constant in the first direction and the distance between both coil sets in the first direction is equal to a multiple of the magnetic period plus a non-zero fraction of the magnetic period such that, in use, the torque is generated by interaction of the coil sets of the second part and the magnet assembly of the first part.

By separating both coil sets in the first direction over a distance equal to a multiple of the magnetic period plus a non-zero fraction of the magnetic period the force generated by the first coil set can be directed in a different direction as the force generated by the second coil set. As a consequence, the drive unit also generates a torque about an axis substantially perpendicular to the first and second direction. By doing so, this torque can, at least partly, compensate the inertial torque acting on the moving assembly (comprising the object table and the second part of the linear motor) due to a mismatch between the center of gravity of the moving assembly and the driving force generated by the drive unit. By doing so, the forces (or the variation of the forces in case a pre-load force is applied) acting on the bearing in the second direction during acceleration or deceleration are reduced. By separating both coil sets over the specified distance, both coil sets will generate a force in a different direction even when supplied with the same currents. Such an arrangement is advantageous because this allows both coil sets to be powered from the same power supply.

In a further embodiment of the present invention, the bearing is a fluid bearing such as an air bearing. Such a bearing has the advantage of being substantially contactless thereby reducing the risk of contamination.

In a further embodiment, the drive unit includes an iron core. In such an arrangement, the interaction between the iron core and the magnet assembly can provide, at least partly, a pre-load force for the bearing.

In an embodiment of the present invention, the positioning device further includes a pre-load assembly constructed and arranged to provide a force in a direction substantially perpendicular to the first direction and the axis.

In an embodiment of the present invention, the drive unit further includes an additional coil set or additional coil sets supplied by the multi-phase power supply. By doing so, the generated motor force is increased.

In an embodiment of the present invention, the multi-phase power supply is a two-phase or a three-phase power supply.

In an embodiment of the present invention, the positioning device is applied in a lithographic apparatus for positioning a patterning device or a substrate.

In a further embodiment of the present invention, the positioning device is provided with a second bearing such that the first part can displace relative to the reference frame in the first direction and wherein the assembly includes the first part. In such an arrangement, the first part is constructed and arranged to displace in the first direction due to the reaction force of the linear motor. By doing so, transmission of the reaction force to other parts of the apparatus can substantially be avoided.

A positioning device according to one of the mentioned embodiments may advantageously be applied in a lithographic apparatus because of the high requirements of such an apparatus with respect to positional accuracy. The present invention ensures that the impact of an inertial torque is reduced. By doing so, no alternative measures such as applying an oversized bearing assembly (measures that would result in a reduction in dynamic performance) are required. The bearing assembly can be reduced in size and weight resulting in an improved performance of the apparatus with respect to dynamic behavior and/or productivity.

A positioning device configured to position an object table relative to a reference frame, in accordance with an embodiment of the invention includes a drive unit including a first part connectable to the reference frame and a second part configured to hold the object table, the drive unit being configured to generate a force in a first direction on the second part to displace the object table in the first direction, and a bearing acting between the second part and the first part such that the second part can be displaced in the first direction by the drive unit, wherein the drive unit is constructed and arranged to generate a torque acting on the second part about an axis substantially perpendicular to the first direction such that the resulting force of the force and the torque is directed substantially through a center of gravity of an assembly including the object table and the second part.

A lithographic apparatus, in accordance with an embodiment of the invention, includes an illumination system configured to condition a radiation beam; a patterning support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a positioning device configured to position an object relative to a reference frame, the positioning device including a drive unit including a first part connectable to the reference frame and a second part configured to hold the object, the drive unit being configured to generate a force in a first direction on the second part to displace the object in the first direction, and a bearing acting between the second part and the first part such that the second part can be displaced in the first direction by the drive unit, wherein the drive unit is constructed and arranged to generate a torque acting on the second part about an axis substantially perpendicular to the first direction such that the resulting force of the force and the torque is directed substantially through a center of gravity of an assembly including the object table and the second part.

A positioning device configured to position an object relative to a reference frame, in accordance with an embodiment of the invention, includes a drive unit including a first part connectable to the reference frame and a second part configured to hold the object, the drive unit being configured to generate a force in a first direction on the second part to move the object table in the first direction, and a bearing configured to space apart the second part from the first part in a second direction substantially perpendicular to the first direction, wherein the drive unit is constructed and arranged to generate a torque acting on the second part about an axis substantially perpendicular to the first and second directions, the torque being configured to counter-balance an initial torque generated during an acceleration or deceleration phase of the second part relative to the part.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4b shows an equivalent representation of the force generated by the linear motor depicted in FIG. 4a.

DETAILED DESCRIPTION

Figure 1:
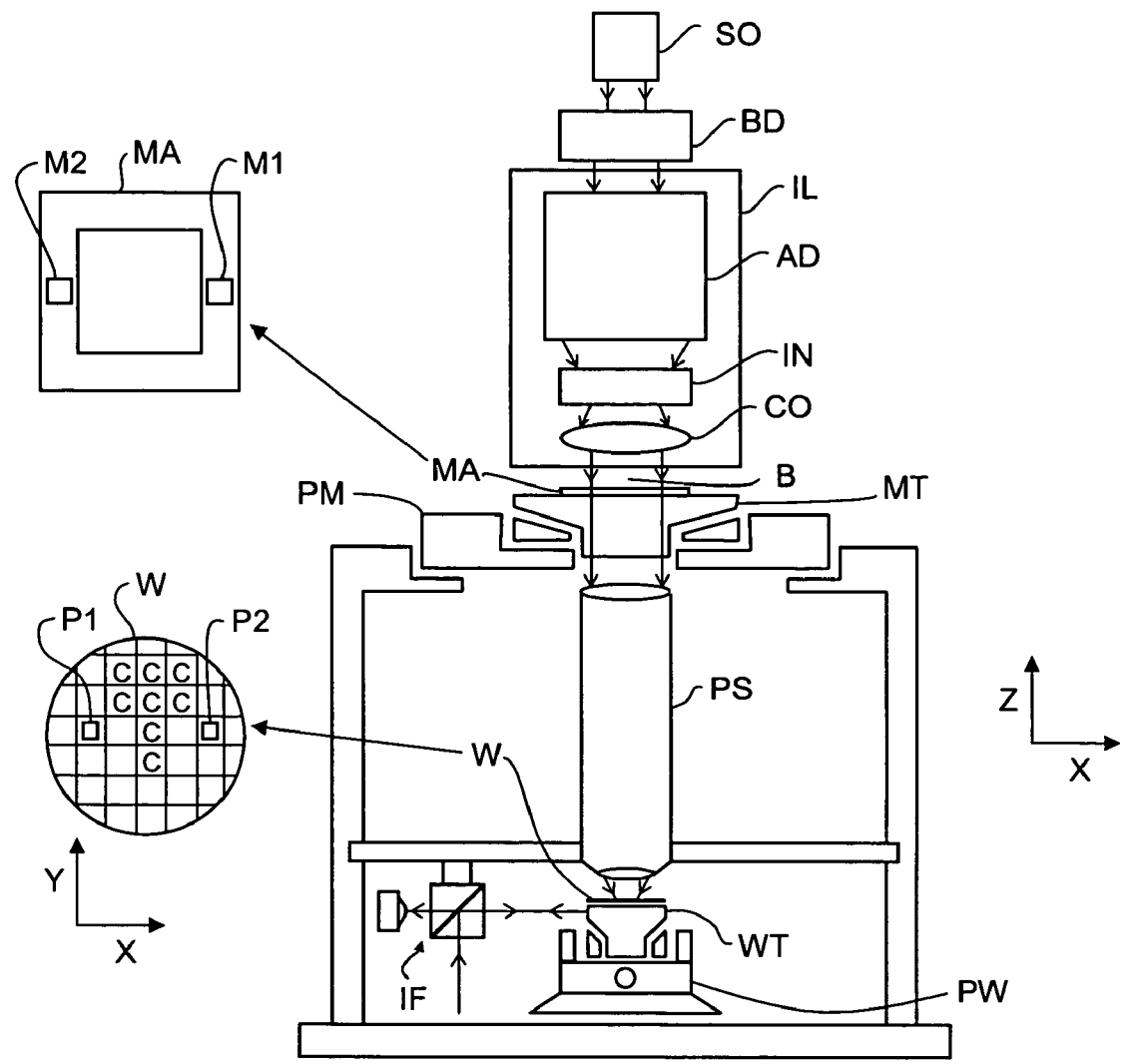
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation) and a support structure (e.g. a mask table) MT configured to support a patterning device (e.g. a mask) MA and connected to a first positioning device PM configured to accurately position the patterning device in accordance with certain parameters. The apparatus also includes a substrate table (e.g. a wafer table) WT configured to hold a substrate (e.g. a resist-coated wafer) W and connected to a second positioning device PW configured to accurately position the substrate in accordance with certain parameters and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. First or second positioning device may also be referred to as a stage assembly. Such a stage assembly is often provided with one or more linear or planar motors. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In order to clearly describe the various embodiments of the present invention, the operation principles of a conventional linear motor are first briefly described.

Figure 2A:
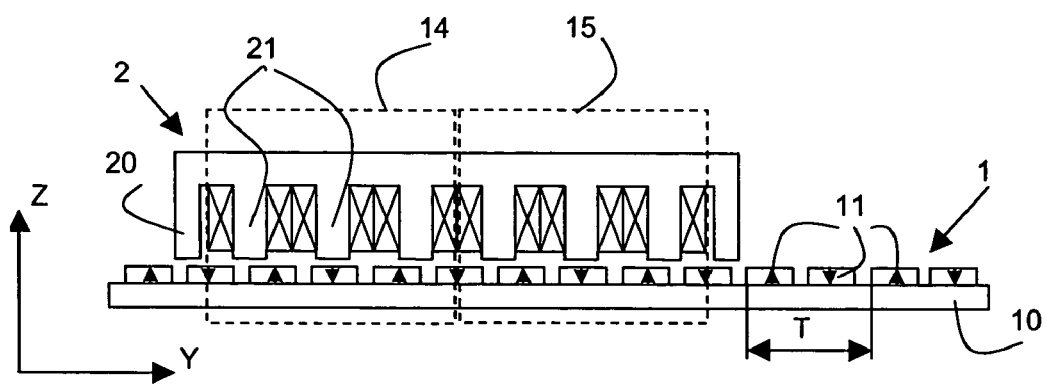
FIG. 2a schematically depicts a cross-sectional view of a conventional linear motor.

FIG. 2a schematically shows a cross-sectional view of a conventional iron core linear motor. The motor includes a first part 1 including a magnet plate 10 equipped with an array of permanent magnets 11. The magnets are magnetized parallel to the Z-direction in an alternating pattern (N S N S . . . ) as indicated by the arrows. The motor further includes a second part 2 including an iron core 20 including a plurality of iron teeth 21. The second part 2 further includes two coil sets (enclosed by the dotted rectangles 14, 15 in FIG. 2a), each including three coils, each coil being wound around a tooth of the iron core. A three-phase current supply can be applied to power the different coils. The total span in the Y-direction of one coil set corresponds to the span of a set of four adjacent magnets or two magnet pairs. In this way, the different coils inside one coil set are spaced apart over ⅔th of the magnetic period T (the magnetic period T corresponds to the distance in Y-direction between two consecutive magnets with the same polarity).

The different coil sets are placed adjacent to each other in such manner that each coil set experiences a similar magnetic field distribution. In other words, in case the first coil of the first coil set is aligned with a north pole, the first coil of the second coil set will also be aligned with a north pole. This means that the force generated by interaction of the current in the first coil of the first coil set and the magnetic field distribution of the magnet plate will be equal to the force generated by interaction of the current in the first coil of the second coil set and the magnetic field distribution of the magnet plate, both in amplitude and orientation (assuming that the same current is applied in the first coil of the first coil set and in the first coil of the second coil set (i.e. they are supplied from the same phase of the three-phase current supply)).

Figure 2B:
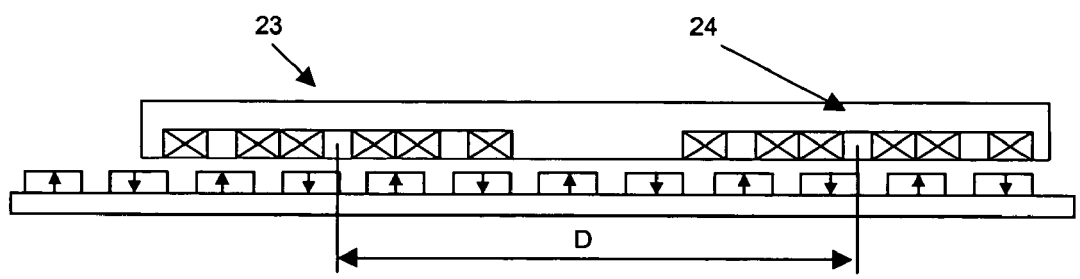
FIG. 2b schematically depicts a cross-sectional view of a conventional planar motor.

In practice, the corresponding coils of the different coil sets may either be connected in series or in parallel. A series connection may be preferred in that it ensures that the current supplied to corresponding coils in the different coil sets is identical. FIG. 2b schematically shows a cross-section of two coil sets as can be found in a planar motor. As can be seen from FIG. 2b, both coil sets are spaced apart over a distance D equal to three times the magnetic period T. Therefore, when both coil sets are supplied from the same power supply, both coil sets will generate a force directed in substantially the same direction. It will be clear that when both coil sets are spaced apart over a multiple of the magnetic period T, the forces generated by the different coil sets when supplied by the same power source operate in the same direction.

In general, the force generated by each of the coil sets can be described in the following manner: when supplied by a three-phase current source, the currents in the different coils in a coil set can be described by the following equation:

$$i1 = I \cdot \sin(\omega \cdot t)$$
$$i2 = I \cdot \sin\left(\omega \cdot t - \frac{2\pi}{3}\right) \quad (1)$$
$$i3 = I \cdot \sin\left(\omega \cdot t - \frac{4\pi}{3}\right)$$

Assuming that the magnetic field distribution is substantially sinusoidal along the magnet array 10 as shown in FIGS. 2a and 2b, the magnetic field distribution can be expressed as:

$$B_Y = B \cdot \sin\left(\frac{2\pi y}{T}\right) \quad (2)$$
$$B_Z = B \cdot \cos\left(\frac{2\pi y}{T}\right)$$

The force generated by interaction of the first coil set and the magnet plate can be easily calculated from the magnetic field properties and geometric properties of the motor. In case the variation of the three-phase currents (according to equation 1) in the different coils is in synchronism with the variation of the magnetic field when both motor parts are displaced relative to each other, the force generated by a coil set can be expressed as $$F_Y = I \cdot B \cdot K \cdot \cos(\alpha)$$
$$F_Z = I \cdot B \cdot K \cdot \sin(\alpha) \quad (3)$$

In equation (3), α represents the commutation angle of the current supplied to the coils. K is the so-called motor constant and is a function of the geometric properties of the motor. The commutation angle α describes the spatial relationship between the current distribution and the magnetic field distribution.

The synchronism as mentioned corresponds to the following relationship between the current variation (in time) and the magnetic field variation (along the Y-direction):

$$\omega \cdot t = \frac{2\pi y}{T} \quad (4)$$

As can be seen from equation (3), the commutation angle determines the orientation of the resulting force of a coil set. By an appropriate choice of the commutation angle, the resulting force may be directed solely in the Y-direction. In most applications this is the preferred situation since it results in the most efficient operation of the motor for displacing the object.

In a similar manner, the resulting force generated by the second coil set of FIG. 2a or 2b can be calculated. Since the second coil set is displaced over a multiple of the magnetic period T, it will be appreciated that equation (3) is equally valid for expressing the resulting force of the second coil set (assuming the second coil set is provided with the same currents as the first coil set).

Therefore, in case N coil sets would be applied adjacent to each other as indicated in FIG. 2a or 2b, the total motor force could be calculated as N times the force as given in equation (3). The linear motors as depicted may be incorporated in a positioning device configured to position an object table. The arrangement of a positioning device combined with an object table to be positioned is also referred to as a stage assembly. Such a stage assembly can be found, for example, in a lithographic apparatus as depicted in FIG. 1. In such an apparatus, a stage assembly may be applied to accurately position the patterning device or mask MA or the wafer or substrate W. Generally, this accurate positioning is performed in a highly conditioned environment (e.g. highly purified air or an inert gas atmosphere). Advantageously, in such a conditioned environment, an air bearing is often provided between both motor parts allowing a relative displacement between both motor parts in the first direction that is substantially frictionless and substantially without a risk for contamination. In case an iron core motor is applied to drive the assembly, this motor may provide at least part of the required pre-load force of the air bearing. Schematically, a possible layout is shown in FIG. 3a.

Figure 3A:
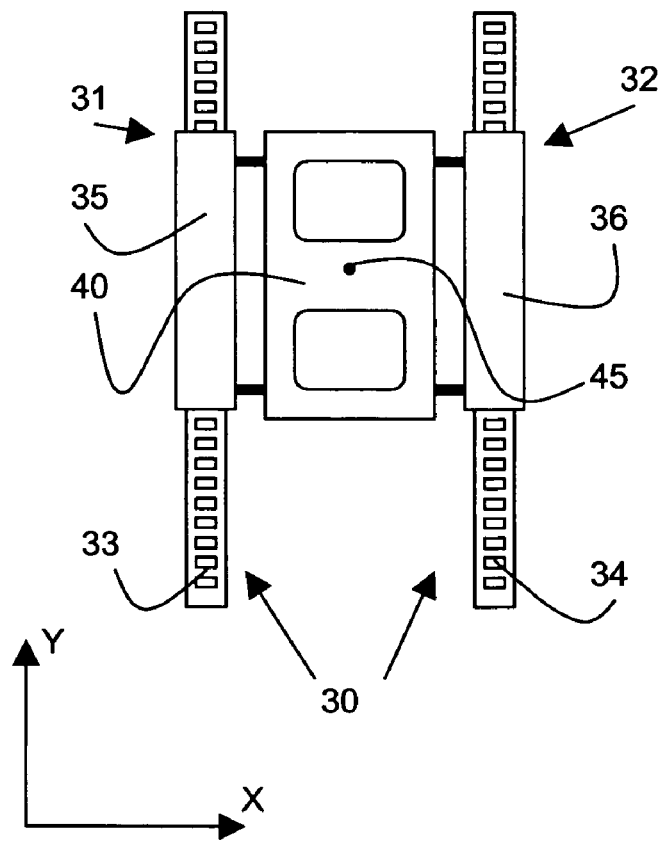
FIG. 3a schematically depicts a positioning device including two linear motors attached to an object table.
Figure 3B:
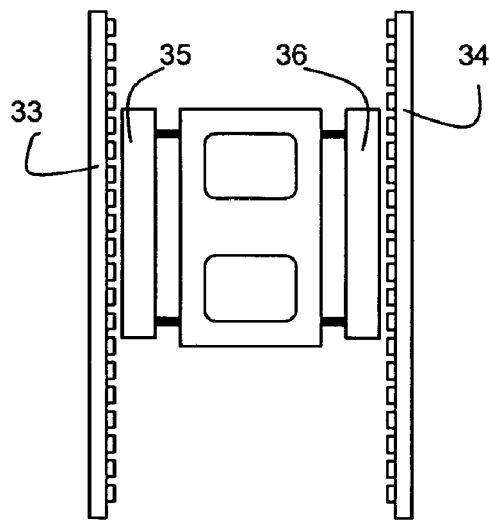
FIG. 3b schematically depicts an alternative arrangement of a positioning device including two linear motors attached to an object table.

FIG. 3a schematically shows a stage assembly including a positioning device 30 attached to an object table 40 that may be provided with, e.g., a patterning device of a lithographic apparatus. The positioning device is equipped with two linear motors 31,32, one on each side of the object table. Each linear motor includes a magnet array 33,34 and a coil assembly 35,36. In case such a symmetric setup can be applied, the resulting force of both motors may be directed through or near the center of gravity 45 of the assembly that is displaced. FIG. 3b shows a somewhat different configuration in that the orientation of the magnet plates and coil assemblies is modified.

A symmetric arrangement as depicted in FIGS. 3a and 3b is not always possible or desired. Often, it is not possible to ensure that the resulting force of the positioning device is directed through or near the center of gravity of the assembly that is displaced. Applying multiple motors to ensure that the resulting force of the positioning device is directed through or near the center of gravity of the assembly would also introduce additional costs. In such situations, the acceleration or deceleration of the assembly to be displaced will result in a torque acting on the assembly due to inertial forces. This is illustrated in FIG. 4a.

Figure 4A:
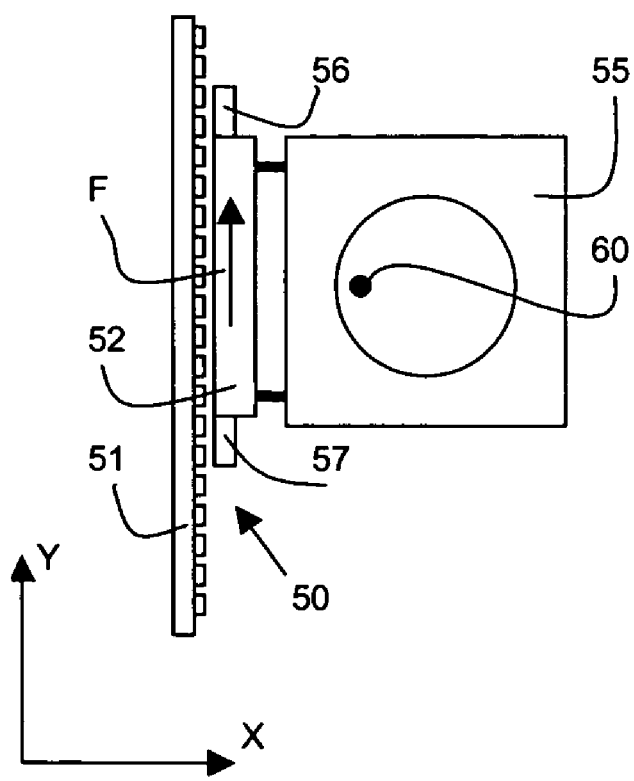
FIG. 4a schematically depicts a positioning device including one linear motor attached to an object table.
Figure 4B:
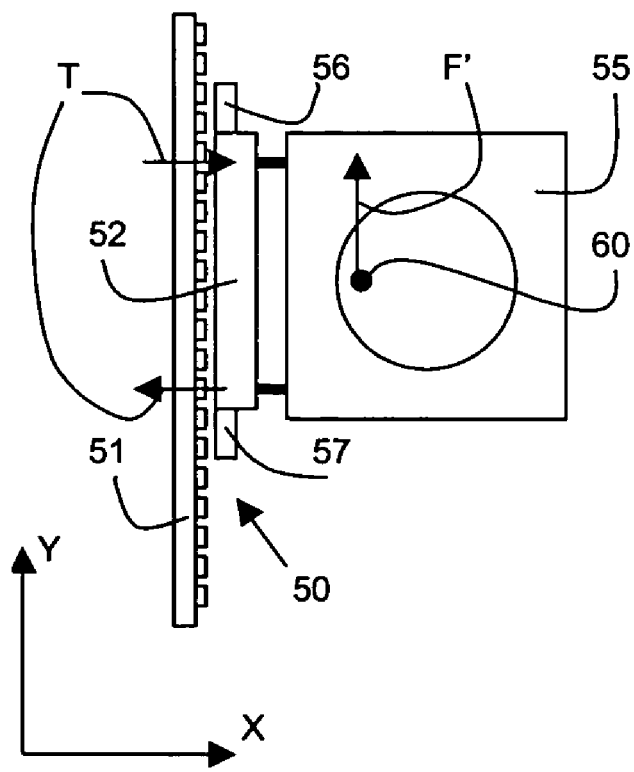

FIG. 4a shows a top view of a positioning device including one linear motor (oriented as the linear motors of FIG. 3b) 50 including a magnet array 51 and a coil assembly 52 and configured to displace an object table 55, the linear motor being located adjacent the object table. Also indicated in FIG. 4a is the resulting force vector F of the linear motor and the center of gravity 60 of the mass that is displaced (i.e. the coil assembly of the linear motor and the object table). The X-position of the coil assembly is maintained using two air bearings (schematically depicted as 56, 57) each on one side of the linear motor. The air bearings may be pre-loaded by the magnetic attraction between the magnet array 51 and the coil assembly 52. In case the force F is directed in the Y-direction, the moving assembly will experience a torque T(T=F*d, distance d corresponding to the difference in X-position of the center of gravity and the force vector F), the occurring torque may disturb the air bearings in the following manner (see FIG. 4b): FIG. 4b schematically shows an alternative representation of the force generated by the motor as shown in FIG. 4a. A force vector F that is not directed through the center of gravity (see FIG. 4a) is equivalent to a force vector F' directed through the center of gravity plus a torque T (represented by two forces of equal size but acting in opposite directions). As can be seen from this representation, due to the occurring torque, the pre-load force will decrease on air bearing 56 and increase on the other bearing 57. Due to this, the air gap between the bearing surfaces may increase in one bearing 56 and decrease in the other 57. This may cause the air bearings to malfunction and may even cause damage to the bearing surfaces in case the surfaces would come in contact with each other. In order to, at least, reduce this effect, embodiments of the present invention apply a modified linear motor that, at least partly, compensates the occurring torque.

Figure 5A:
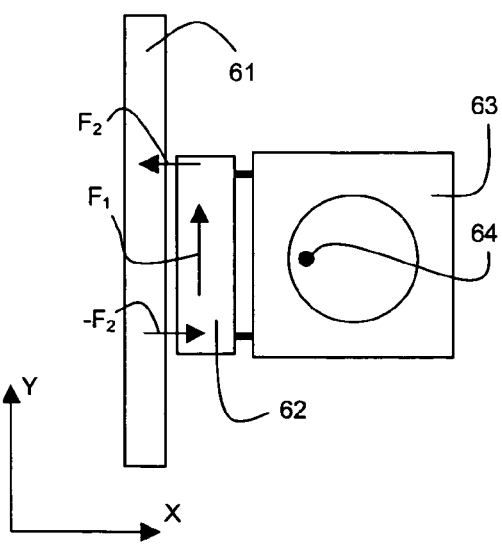
FIG. 5a schematically depicts a motor in accordance with an embodiment of the present invention.

In an embodiment of the present invention, the aforementioned problem is alleviated by applying a drive unit that can both generate a force in the first direction and a torque. FIG. 5a schematically shows an example such a drive unit in a positioning device similar to the device shown in FIGS. 4a and 4b. The drive unit includes a first part 61 and a second part 62 attached to an object table 63. The drive unit is constructed and arranged to generate a force $F_1$ in the Y-direction and a torque, represented by the forces $F_2$ and $-F_2$. In such an arrangement, an inertial torque acting on the moving assembly (including the object table 63 and the second part 62) due to the mismatch of the force $F_1$ and the center of gravity 64 can, at least partly, be compensated by the torque. As an example of such an embodiment, the drive unit may include two or more linear motors that can generate a force having components in both the Y-direction and the X-direction. A conventional linear motor such as depicted in FIG. 2a or 2b may be applied for this purpose.

Figure 5B:
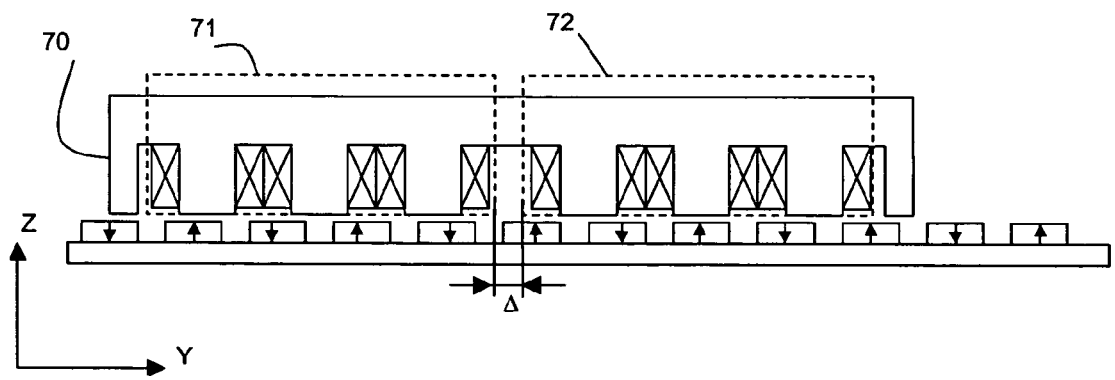
FIG. 5b schematically depicts a cross-sectional view of a motor in accordance with an embodiment of the present invention.

FIG. 5b shows a cross-sectional view of a motor that can be applied in another embodiment of the present invention. A drive unit according to this embodiment includes an iron yoke 70 and two coil sets (enclosed by the dotted lines 71, 72). Both coil sets include three coils that are powered by a three-phase current source common to both coil sets. Both coil sets are arranged adjacent to each other along the Y-direction (the direction of movement). Compared to the linear motor depicted in FIG. 2a, the second coil set is displaced relative to the first coil set in the Y-direction over a distance Δ. By doing so, the position of the first coil set relative to the periodic magnetic field distribution is different from the relative position of the second coil set vs. the periodically alternating magnetic field distribution. As can be seen from FIG. 5b, the middle coil of coil set 71 is positioned in between two magnets (seen in the Y-direction) while the middle coil of coil set 72 is aligned with a magnet (with respect to the Y-direction). In case both coil sets are powered by the same power supply, one could say that both coil sets actually operate with a different commutation angle. Due to the introduction of the relative displacement of both coil sets over a distance $\Delta$, the second coil set has an effective commutation angle $\alpha+\beta$ wherein $\beta=2\pi\Delta/T$, where the first coil set has a commutation angle equal to $\alpha$. Therefore, when both coil sets are powered with the same currents (same amplitude & phase angle), the force generated by the first coil set will be directed in a different direction than the force generated by the second coil set (as can be derived from equation 3). As a result of that, the linear motor will produce both a force in a pre-defined direction (e.g. the Y-direction) and a torque. As will be illustrated, the torque may, at least partly, compensate the torque that occurs due to a misalignment of the driving force and the center of gravity. In general, the described effect is obtained when the difference in Y-position of both coil sets is equal to a multiple of T plus a non-zero fraction ($\Delta$) of the magnetic period T.

Referring to FIG. 5b, the middle coil of the first coil set is aligned in between two magnets while the middle coil of the second coil set is aligned with a magnet. So, the distance between both coil sets equals $2 \times T + \frac{1}{4}$ of the magnetic period T ($\Delta = \frac{1}{4}$ T). By doing so, the effective commutation angle of the second coil set is increase by an angle $\beta=90°$. Depending on the commutation angle that is applied (see equation 2), the direction of the force generated by either coil set may be directed in any direction in the XY-plane. Assuming that the commutation angle $\alpha$ is defined by the relative position (in Y-direction) between the first coil set and the magnet array, it will be appreciated that the commutation angle for the second coil set is actually $\alpha+90°$ (in general: $\alpha+\beta$). Applying equation (3) to calculate the forces generated by the two coil sets gives the following results (table 1) (note that due to the different orientation of the motor compared to the motor of FIG. 2a, the second equation of equation (3) describes a force in the X-direction instead of the Z-direction):

|  | Coil set 1 |  | Coil set 2 |  |
| --- | --- | --- | --- | --- |
| $\alpha = 0°$ | Fx = 0 | Fy = I · B · K | Fx = I · B · K | Fy = 0 |
| $\alpha = -45°$ | Fx = -I · B · K · sin(45°) | Fy = I · B · K · cos(45°) | Fx = I · B · K · sin(45°) | Fy = I · B · K · cos(45°) |
| $\alpha = -90°$ | Fx = -I · B · K | Fy = 0 | Fx = 0 | Fy = I · B · K |

As can be seen from table 1, due to the introduction of the displacement of the second coil set relative to the first coil set, the direction of the generated force is different for both coil sets. Apart from a force component in the direction of movement (Y-direction), also a force-component is introduced perpendicular to this direction. In an embodiment of the invention, the situation $\alpha=-45°$ (in general: $\alpha=-\beta/2$) is used because it results in the highest force component in the Y-direction and because the resulting force in the X-direction (a force that could disturb the bearing) is substantially zero.

Figure 6A:
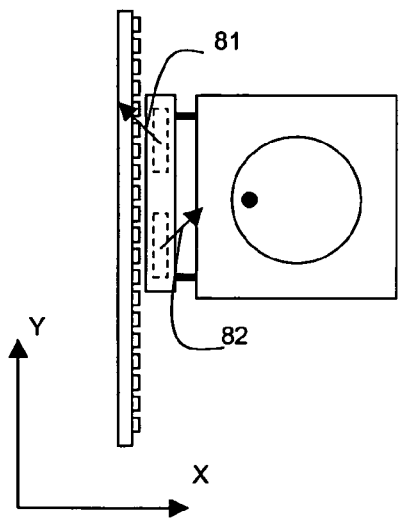
FIG. 6a schematically depicts a stage assembly in accordance with an embodiment of the present invention and the forces generated by the motor.
Figure 6B:
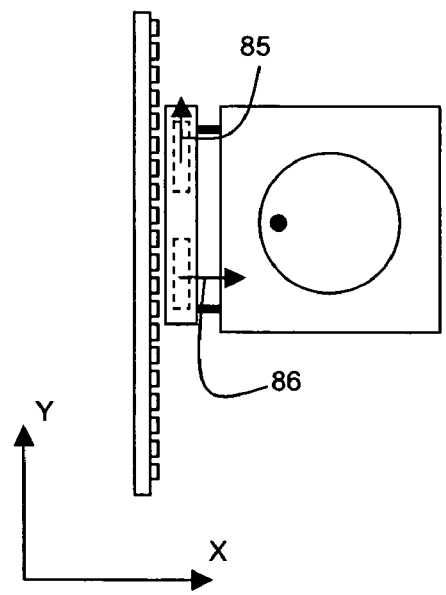
FIG. 6b schematically depicts a stage assembly according to FIG. 6a where the forces generated by the motor are shown for a different commutation angle applied to the motor.

The impact of displacing both coil sets on the direction of the generated force is further illustrated in FIGS. 6a and 6b. FIG. 6a schematically shows the forces generated by the linear motor of FIG. 5 in an assembly similar to the one shown in FIG. 4a. FIG. 6a schematically shows a drive unit configured to displace an object table in the Y-direction, including two coil sets. The corresponding arrows 81, 82 indicate the generated force of each coil set. Note that the commutation angle $\alpha=-45°$ is applied. Taking into account the position of the center of gravity as indicated, it will be clear that the resulting torque acting on the moving assembly is significantly reduced compared to the situation as depicted in FIG. 4a. It should be noted that a similar result can be obtained in case a different commutation angle is applied. This is illustrated in FIG. 6b where a commutation angle of $\alpha=0°$ is applied, resulting in the forces as indicated by the arrows 85, 86. It should be noted that the selected commutation angle also affects the resulting force generated in the driving direction (i.e. the Y-direction). Further, it should be clear that the geometry of the linear motor and its position with respect to the center of gravity affect to what degree the occurring torque due to inertial forces can be compensated.

FIGS. 6a and 6b illustrate the generated forces of the different coil sets in case the object table is accelerated. It will be clear that in case the object table is decelerated, a similar compensation of the torque may be obtained.

Figure 7A:
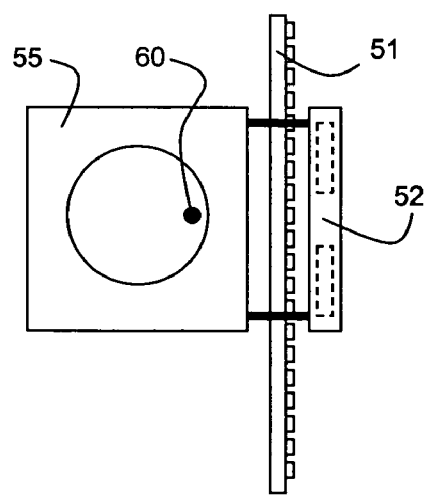
FIG. 7a schematically depicts a stage assembly in accordance with an embodiment of the present invention having the center of gravity on the other side of the motor.

In case the center of gravity of the moving assembly would be located on the other side of the linear motor (with respect to the X-position), the linear motor can be modified. A possible stage assembly having the center of gravity on the other side of the motor is shown in FIG. 7a. One can recognize the corresponding items of FIG. 4a by the reference numbers. Applying the motor forces as illustrated in FIG. 6a or 6b would lead to an increase of the torque acting on the air bearings. Applying a negative value for the distance $\Delta$ can reverse the direction of the generated torque. In practice, this could be cumbersome since this would require the different coil sets to be brought closer together. Referring to the linear motor depicted in FIG. 4a, this would not be possible without altering the geometry of the coils. However, because of the periodic nature of the magnet array, introducing a distance A between both coil sets is similar to separating both coil sets over a distance $\Delta+T$.

Figure 7B:
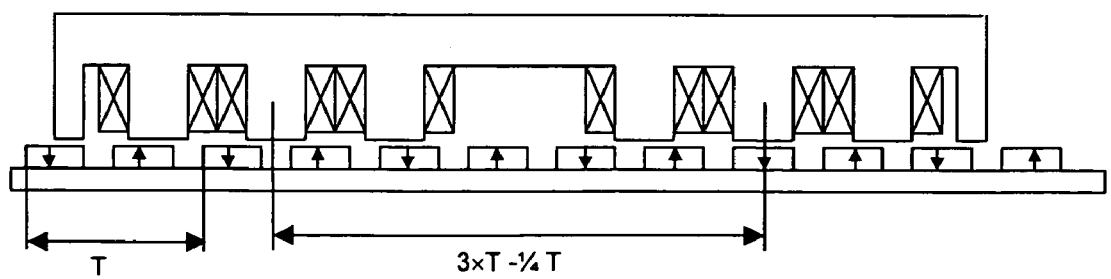
FIG. 7b schematically depicts the cross-section of a second motor in accordance with an embodiment of the present invention.
Figure 7C:
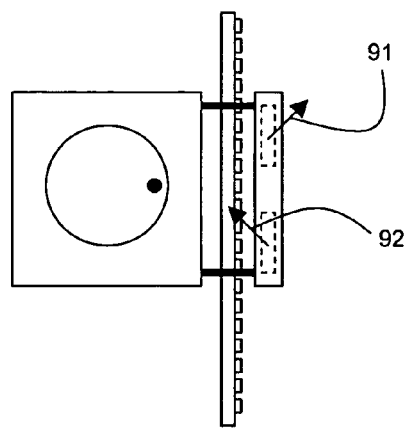
FIG. 7c schematically depicts a stage assembly in accordance with an embodiment of the present invention and the forces generated by the motor in case the center of gravity is located on the opposite side of the motor.

A linear motor having two coil sets that are separated over a distance $3 \times T+\Delta$, with $\Delta=-\frac{1}{4}$ T is shown in FIG. 7b. In order to generate the appropriate forces for, at least partly, compensating the inertial torque, a commutation angle of e.g. 45° could be applied for the first coil set of such a motor. The corresponding commutation angle for the second coil set would then be $-45°$ (because the additional commutation angle $\beta$ corresponds to $-90°$ for the motor depicted in FIG. 7b). FIG. 7c schematically depicts the generated forces 91, 92 for both coil sets.

Figure 8:
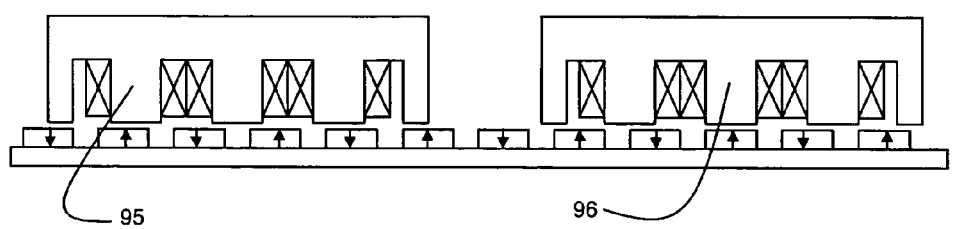
FIG. 8 schematically depicts the cross-section of a third motor in accordance with an embodiment of the present invention.

A further embodiment of the present invention is shown in FIG. 8. FIG. 8 schematically shows a linear motor including two coil sets and two iron core units 95, 96, one for each coil set. In this way the linear motor can be build up of different units enabling a more flexible choice of the distance between both coil units. Both coil sets and their iron core can be manufactured as separate units and assembled afterwards to result in the linear motor as applied. Depending on the application (i.e. the actual layout of the stage assembly) a large or a small value for the angle $\beta$ (or distance $\Delta$) may be used. In case there is a substantial mismatch between the center of gravity and the position of the actuator force, it may be advantageous to displace both coil units over an angle $\beta+T$ or $\beta+$a multiple of T, in an embodiment of the invention. By increasing the distance between the different coil sets, the compensating torque can be increased substantially without a decrease of the driving force.

Figure 9:
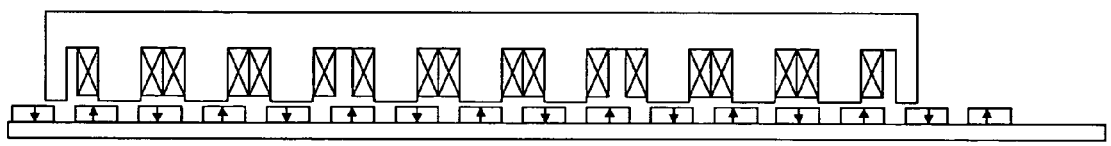
FIG. 9 schematically depicts the cross-section of a fourth motor in accordance with an embodiment of the present invention.

In a further embodiment of the present invention, the motor is equipped with an additional coil set or additional coil sets positioned between the first and second coil set. FIG. 9 shows a possible arrangement. FIG. 9 shows a linear iron core motor comprising three coil sets, the distance between adjacent coil sets being substantially equal to 2×T+⅛×T. In FIG. 9, all three coil sets may be powered by the same three-phase power supply. In case the commutation angle α is defined from the relative position of the middle coil set and the magnet array, one can easily see that the effective commutation angle for the first coil set is actually α−45° while the third coil set has an effective commutation angle equal to α+45°. Such an arrangement may also be obtained by providing each coil set with an iron core, similar to the arrangement of FIG. 8. Further, it will be clear to a person skilled in the art that by introducing additional coil sets and selecting the various gaps between the coil sets, one can optimize the generated compensating torque taking into account the actual geometry of the positioning device and object table.

The following figures show some possible bearing arrangements that may be applied in a positioning device according to embodiments of the present invention.

Figure 10A:
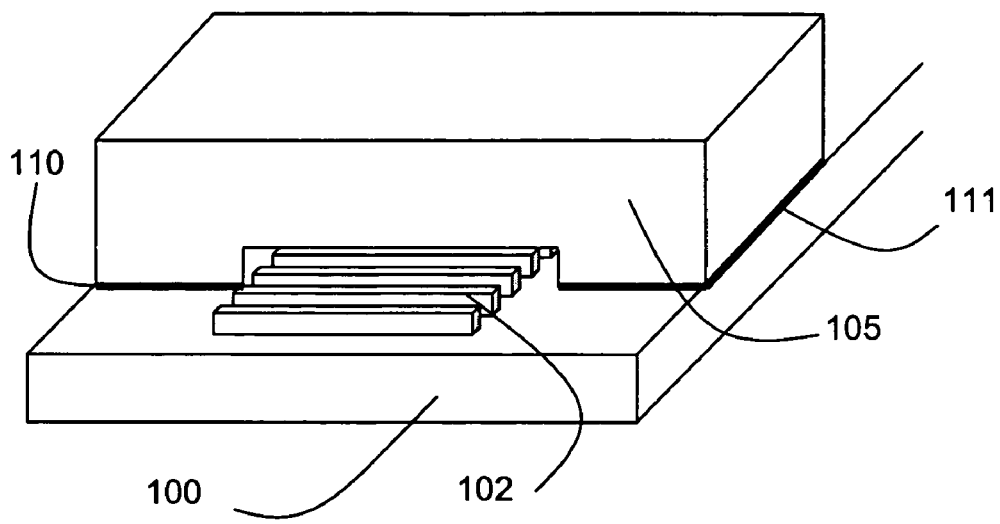
FIG. 10a schematically depicts a motor arrangement combined with a bearing arrangement in accordance with an embodiment of the present invention.
Figure 10B:
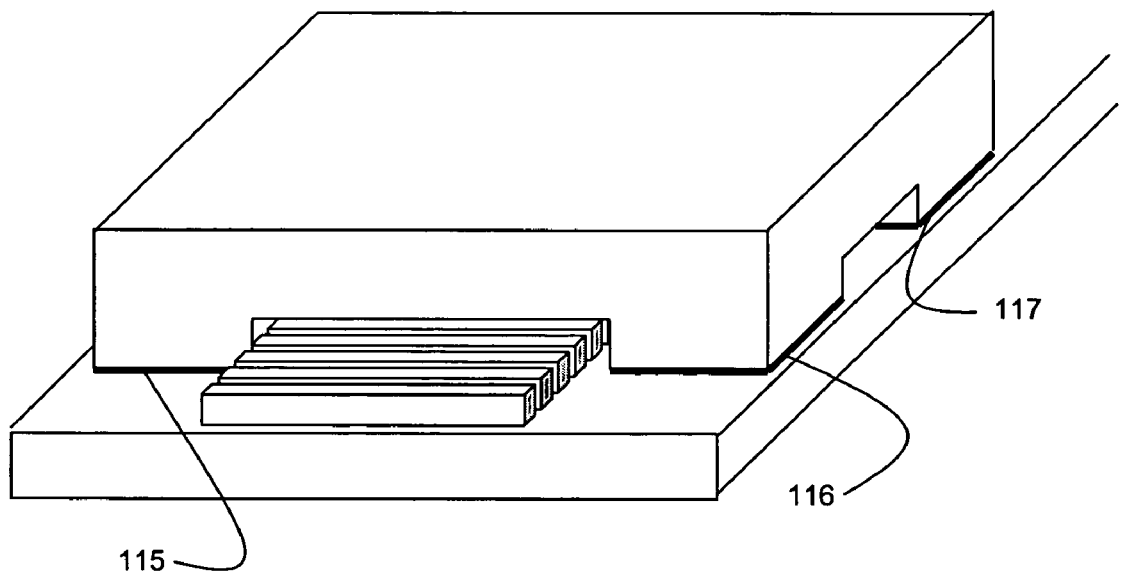
FIG. 10b schematically depicts a motor arrangement combined with a further bearing arrangement in accordance with an embodiment of the present invention.
Figure 11:
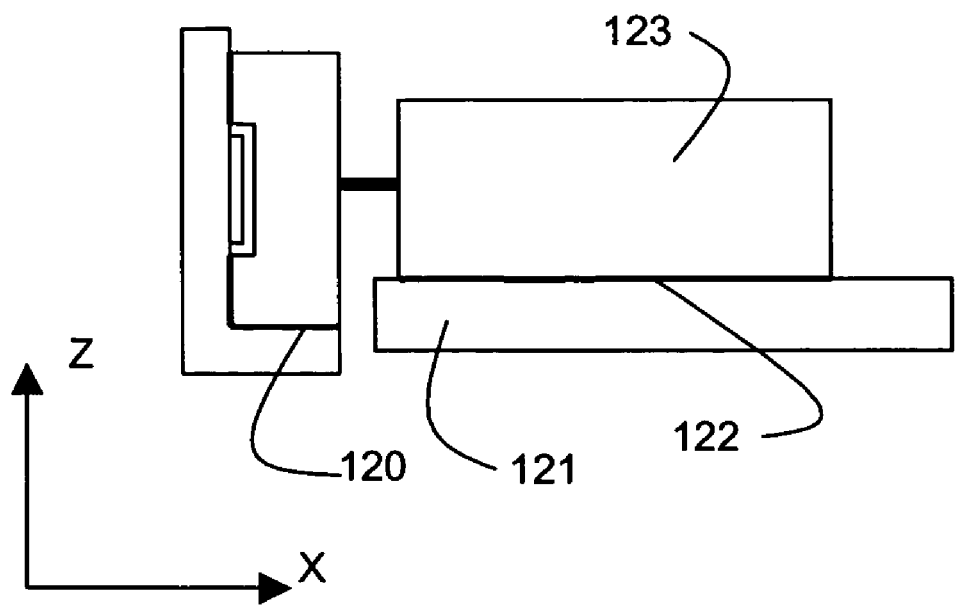
FIG. 11 schematically depicts a front view of a stage assembly including a drive unit arrangement according to FIG. 10a or 10b.

FIG. 10a schematically shows a drive unit arrangement including a first part 100 equipped with a magnet array 102 and a second part 105 equipped with a coil assembly (not shown). Along both sides of the magnet array, bearing surfaces (or pads) 110, 111 are provided between the first and second part. Both surfaces 110, 111 extend along the direction of movement of drive unit. FIG. 10b shows an arrangement having four bearing pads of which three are visible (115, 116, 117). FIG. 11 shows a front view of a stage assembly including a drive unit arrangement according to FIG. 10a or 10b. In this assembly, an additional bearing 120 is provided for supporting the coil assembly in the Z-direction. In this arrangement, the object table 123 is supported on a separate frame 121 by a bearing 122.

Figure 12:
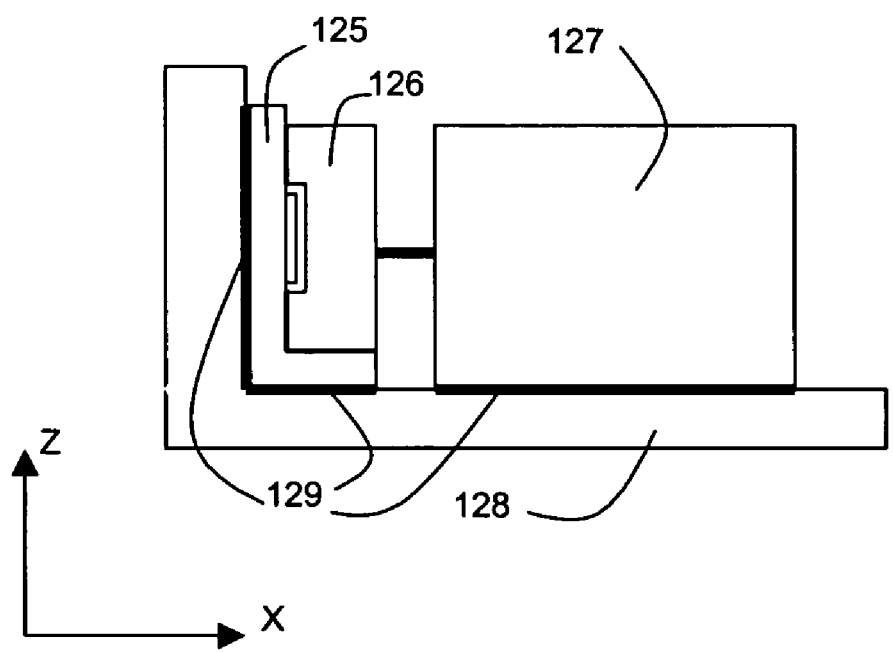
FIG. 12 schematically depicts a front view of a stage assembly including a balance mass arrangement in accordance with an embodiment of the invention.

FIG. 12 shows a further arrangement wherein the magnet assembly 125 is arranged to move in the first direction due to the reaction force of the motor. In such an arrangement, the magnet assembly acts as a balance mass; when the coil assembly 126 and the object table 127 move in the positive first direction, the magnet assembly 125 will move in the negative first direction. Such an arrangement is beneficial because vibrations caused by the reaction force are substantially reduced because the reaction force is applied to move the magnet assembly. Such an arrangement may beneficially be applied in a lithographic apparatus because of the high demands with respect to positional accuracy. In this arrangement, both the magnet assembly 125 and the object table 127 are supported on the same frame 128 by bearings 129, but this is not an absolute requirement, the magnet assembly and the object table may also be supported on separate frames.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. In particular, it should be noticed that the present invention may be applied with various types of bearings including ball bearings and with various types of motors, such as linear motors (with or without an iron core) or planar motors. The invention may favorably be applied in any application where, due to circumstances, there is a mismatch between the center of gravity of the mass to be displaced and the position of the force vector.

The descriptions above are intended to be illustrative, not limiting. Thus, it will be apparent to one skilled in the art that modifications may be made to the invention as described without departing from the scope of the claims set out below.

What is claimed is:

1. A positioning device configured to position an object table relative to a reference frame, comprising:
   a drive unit including a first part coupled to said reference frame and a second part coupled to said object table, said drive unit being configured to generate a force in a first direction on said second part to displace said object table in said first direction, and
   a bearing acting between said second part and said first part such that said second part can be displaced in said first direction by said drive unit,
   wherein said drive unit is constructed and arranged to generate a torque acting on said second part about an axis substantially perpendicular to said first direction such that the resulting force of said force and said torque is directed substantially through a center of gravity of an assembly comprising said object table and said second part.

2. The positioning device of claim 1, wherein said first part comprises a magnet assembly provided with an array of permanent magnets constructed and arranged to generate a periodically alternating magnetic field distribution, and wherein said second part comprises a coil assembly provided with a first and a second coil set positioned adjacent to each other in substantially said first direction.

3. The positioning device of claim 2, wherein said positioning device further comprises a first multiphase power supply configured to power said first coil set and a second multiphase power supply configured to power said second coil set.

4. The positioning device of claim 2, wherein said magnetic field distribution has a magnetic period that is substantially constant in said first direction.

5. The positioning device of claim 4, wherein a distance between both coil sets in said first direction is equal to a multiple of the magnetic period plus a non-zero fraction of the magnetic period, such that said torque is generated by interaction of said coil sets of said second part and said magnet assembly of said first part.

6. The positioning device of claim 5, wherein said positioning device further comprises a multiphase power supply configured to power both coil sets.

7. The positioning device of claim 1, wherein said bearing is a fluid bearing.

8. The positioning device of claim 1, wherein said second part comprises an iron core.

9. The positioning device of claim 2, wherein said second part further comprises an additional coil set or additional coil sets.

10. The positioning device of claim 1, further comprising a pre-load assembly constructed and arranged to provide a force in a direction substantially perpendicular to said first direction and said axis.

11. The positioning device of claim 1, further comprising a second bearing that acts between said first part and said reference frame such that said first part can be displaced relative to said reference frame in substantially said first direction and wherein said assembly comprises said first part.

12. The positioning device of claim 1, wherein said first part is connected to said reference frame.

13. A lithographic apparatus comprising:
(a) an illumination system configured to condition a radiation beam;
(b) a patterning support constructed to support a patterning device, the patterning device being capable of imparting the radiation beam with a pattern in its cross-section to form a patterned radiation beam;
(c) a substrate table constructed to hold a substrate;
(d) a projection system configured to project the patterned radiation beam onto a target portion of the substrate, and
(e) a positioning device configured to position an object relative to a reference frame, the positioning device including:
(i) a drive unit including a first part coupled to said reference frame and a second part coupled to said object, said drive unit being configured to generate a force in a first direction on said second part to displace said object in said first direction, and
(ii) a bearing acting between said second part and said first part such that said second part can be displaced in said first direction by said drive unit,
wherein said drive unit is constructed and arranged to generate a torque acting on said second part about an axis substantially perpendicular to said first direction such that the resulting force of said force and said torque is directed substantially through a center of gravity of an assembly comprising said object and said second part.

14. The lithographic apparatus of claim 13, wherein said object is the substrate table or the patterning support.

15. The lithographic apparatus of claim 13, wherein said first part comprises a magnet assembly provided with an array of permanent magnets constructed and arranged to generate a periodically alternating magnetic field distribution, and wherein said second part comprises a coil assembly provided with a first and a second coil set positioned adjacent to each other in substantially said first direction.

16. The lithographic apparatus of claim 15, wherein said positioning device further comprises a first multiphase power supply configured to power said first coil set and a second multiphase power supply configured to power said second coil set.

17. The lithographic apparatus of claim 15, wherein said magnetic field distribution has a magnetic period that is substantially constant in said first direction.

18. The lithographic apparatus of claim 17, wherein a distance between both coil sets in said first direction is equal to a multiple of the magnetic period plus a non-zero fraction of the magnetic period, such that said torque is generated by interaction of said coil sets of said second part and said magnet assembly of said first part.

19. The lithographic apparatus of claim 18, wherein said positioning device further comprises a multiphase power supply configured to power both coil sets.

20. The lithographic apparatus of claim 13, wherein said bearing is a fluid bearing.

21. The lithographic apparatus of claim 13, wherein said second part comprises an iron core.

22. The lithographic apparatus of claim 14, wherein said second part further comprises an additional coil set or additional coil sets.

23. The lithographic apparatus of claim 13, further comprising a pre-load assembly constructed and arranged to provide a force in a direction substantially perpendicular to said first direction and said axis.

24. A positioning device configured to position an object relative to a reference frame, comprising:
a drive unit including a first part and a second part, the second part coupled to said object, said drive unit being configured to generate a force in a first direction on said second part to move said object in said first direction, and
a bearing configured to space apart said second part from said first part in a second direction substantially perpendicular to said first direction,
wherein said drive unit is constructed and arranged to generate a torque acting on said second part about an axis substantially perpendicular to said first and second directions, said torque being configured to counterbalance an initial torque generated during an acceleration or deceleration phase of said second part relative to said part.

25. The positioning device of claim 1, wherein the second part is configured to hold the object table.

26. The lithographic apparatus of claim 13, wherein the second part is configured to hold the object.

27. The positioning device of claim 24, wherein the second part is configured to hold the object.

28. The positioning device of claim 24, wherein the object is a substrate table or a patterning device support of a lithographic apparatus.

29. The positioning device of claim 24, wherein the first part is coupled to the reference frame.

* * * * *